(12) United States Patent
Imada

(10) Patent No.: US 10,910,534 B2
(45) Date of Patent: Feb. 2, 2021

(54) LIGHT-EMITTING DEVICE AND SURFACE-EMITTING LIGHT SOURCE

(71) Applicant: NICHIA CORPORATION, Anan (JP)

(72) Inventor: Mamoru Imada, Anan (JP)

(73) Assignee: NICHIA CORPORATION, Anan (JP)

( * ) Notice: Subject to any disclaimer, the term of this patent is extended or adjusted under 35 U.S.C. 154(b) by 0 days.

(21) Appl. No.: 16/430,176

(22) Filed: Jun. 3, 2019

(65) Prior Publication Data

US 2019/0371985 A1 Dec. 5, 2019

(30) Foreign Application Priority Data

Jun. 4, 2018 (JP) .................... 2018-107084

(51) Int. Cl.
| | | |
|---|---|---|
| *H01L 33/00* | (2010.01) | |
| *H01L 33/60* | (2010.01) | |
| *F21V 23/00* | (2015.01) | |
| *F21V 8/00* | (2006.01) | |
| *H01L 33/38* | (2010.01) | |

(52) U.S. Cl.
CPC ............ *H01L 33/60* (2013.01); *F21V 23/002* (2013.01); *G02B 6/0055* (2013.01); *H01L 33/38* (2013.01)

(58) Field of Classification Search
CPC ........ H01L 33/38; H01L 33/387; H01L 33/60
See application file for complete search history.

(56) References Cited

U.S. PATENT DOCUMENTS

| | | |
|---|---|---|
| 2006/0289201 A1 | 12/2006 | Kim et al. |
| 2007/0121340 A1 | 5/2007 | Hoshi |
| 2011/0149594 A1 | 6/2011 | Terajima et al. |
| 2011/0164402 A1 | 7/2011 | Kang et al. |
| 2015/0263230 A1* | 9/2015 | Katsuno ................. H01L 33/32 257/99 |
| 2016/0103277 A1 | 4/2016 | Wu et al. |
| 2016/0118549 A1* | 4/2016 | Kim ...................... H01L 33/486 257/98 |

FOREIGN PATENT DOCUMENTS

| | | |
|---|---|---|
| JP | 2007-5302 A | 1/2007 |
| JP | 2007-149451 A | 6/2007 |
| JP | 2007-227286 A | 9/2007 |
| JP | 2010-55976 A | 3/2010 |
| JP | 2010-56358 A | 3/2010 |
| JP | 2011-142079 A | 7/2011 |
| JP | 2011-210674 A | 10/2011 |
| JP | 2016-81786 A | 5/2016 |

* cited by examiner

*Primary Examiner* — Samuel A Gebremariam

(74) *Attorney, Agent, or Firm* — Birch, Stewart, Kolasch & Birch, LLP

(57) ABSTRACT

According to one embodiment, the light guide plate has a first major surface, a second major surface, a side surface, and a recess. The recess is provided in the second major surface. The fluorescent layer is provided in the recess. The light-emitting element is bonded to the fluorescent layer and includes an electrode on a surface of the light-emitting element on a side opposite to a surface of the light-emitting element bonded to the fluorescent layer. The module side surface includes at least a portion of the side surface of the light guide plate. The first interconnect is provided along the second major surface and connected to the electrode of the light-emitting element. The second interconnect is provided on the module side surface and connected to the first interconnect.

10 Claims, 10 Drawing Sheets

US 10,910,534 B2

LIGHT-EMITTING DEVICE AND SURFACE-EMITTING LIGHT SOURCE

CROSS-REFERENCE TO RELATED APPLICATION

This application is based upon and claims the benefit of priority from Japanese Patent Application No. 2018-107084, filed on Jun. 4, 2018; the entire contents of which are incorporated herein by reference.

FIELD

This invention described herein relate to a light-emitting device and a surface-emitting light source.

BACKGROUND

A light-emitting device that uses a light-emitting element such as a light-emitting diode or the like is utilized widely in, for example, a surface-emitting light source such as the backlight of a liquid crystal display, etc. For example, it is highly desirable to reduce the thickness of the surface-emitting light source in a direct-type liquid crystal display in which the surface-emitting light source is disposed at the back surface of the liquid crystal panel.

SUMMARY

According to an embodiment of the invention, a light-emitting device includes a light guide plate, a fluorescent layer, a light-emitting element, a module side surface, a first interconnect, and a second interconnect. The light guide plate has a first major surface, a second major surface, a side surface between the first and second major surfaces, and a recess. The first major surface functions as a light-emitting surface. The second major surface is located on a side opposite to the first major surface. The recess is provided in the second major surface. The fluorescent layer is provided in the recess. The light-emitting element is bonded to the fluorescent layer and includes an electrode on a surface of the light-emitting element on a side opposite to a surface of the light-emitting element bonded to the fluorescent layer. The module side surface includes at least a portion of the side surface of the light guide plate. The first interconnect is provided along the second major surface and connected to the electrode of the light-emitting element. The second interconnect is provided on the module side surface and connected to the first interconnect.

DETAILED DESCRIPTION

Figure 1:
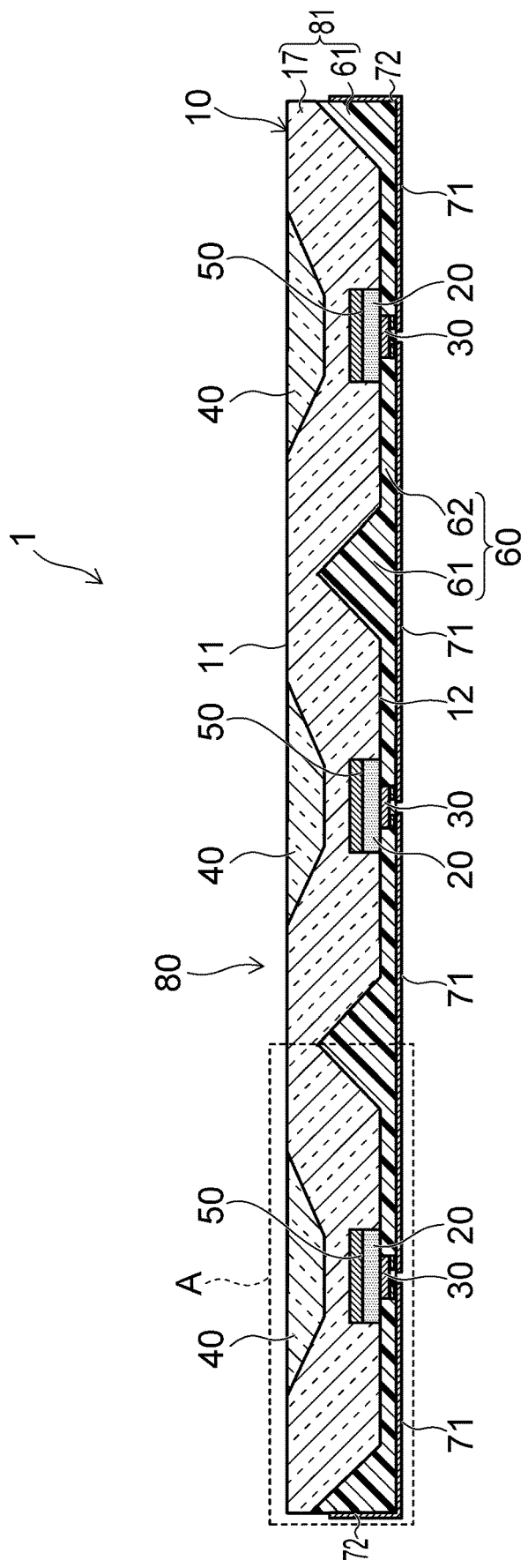
FIG. 1 is a schematic cross-sectional view of a light-emitting device of an embodiment.

Embodiments will now be described with reference to the drawings. The same components in the drawings are marked with the same reference numerals.

FIG. 1 is a schematic cross-sectional view of a light-emitting device 1 of an embodiment.

The light-emitting device 1 includes a light guide plate 10, a light-emitting element 30, a fluorescent layer 20, a light-reflective resin member 60, a first interconnect 71, and a second interconnect 72. The light guide plate 10 and the light-reflective resin member 60 are included in a module main body 80 used as the exterior of the light-emitting device 1.

In the example shown in FIG. 1, the light-emitting device includes multiple light-emitting elements 30. Or, one light-emitting element 30 may be included in the light-emitting device 1.

Figure 2:
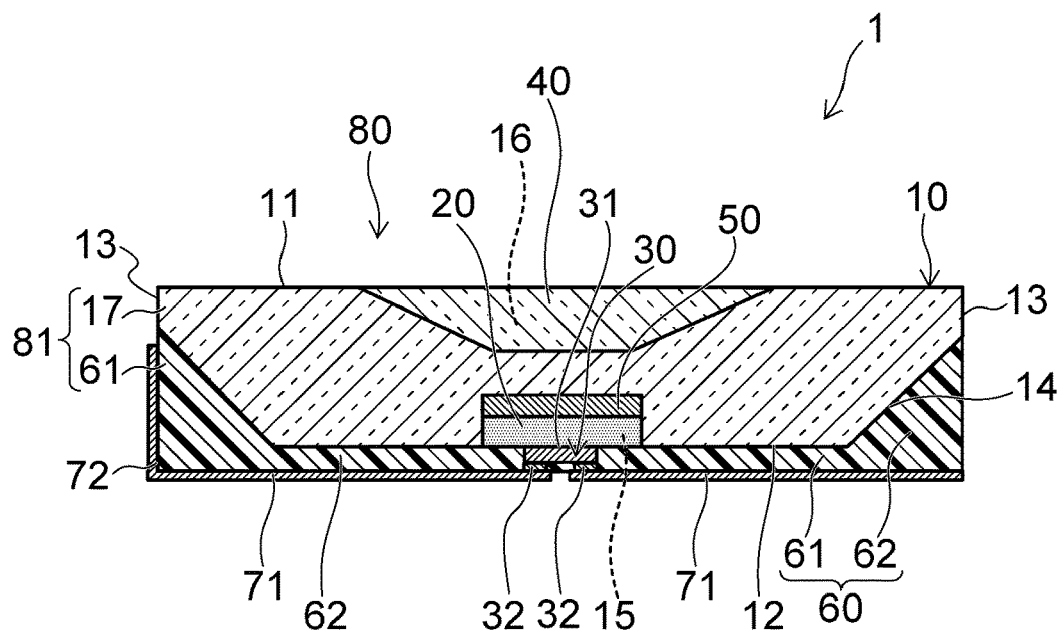
FIG. 2 is an enlarged cross-sectional view of portion A in FIG. 1.

FIG. 2 is an enlarged cross-sectional view of a portion (portion A) of the light-emitting device 1 shown in FIG. 1 including one light-emitting element 30.

Figure 3:
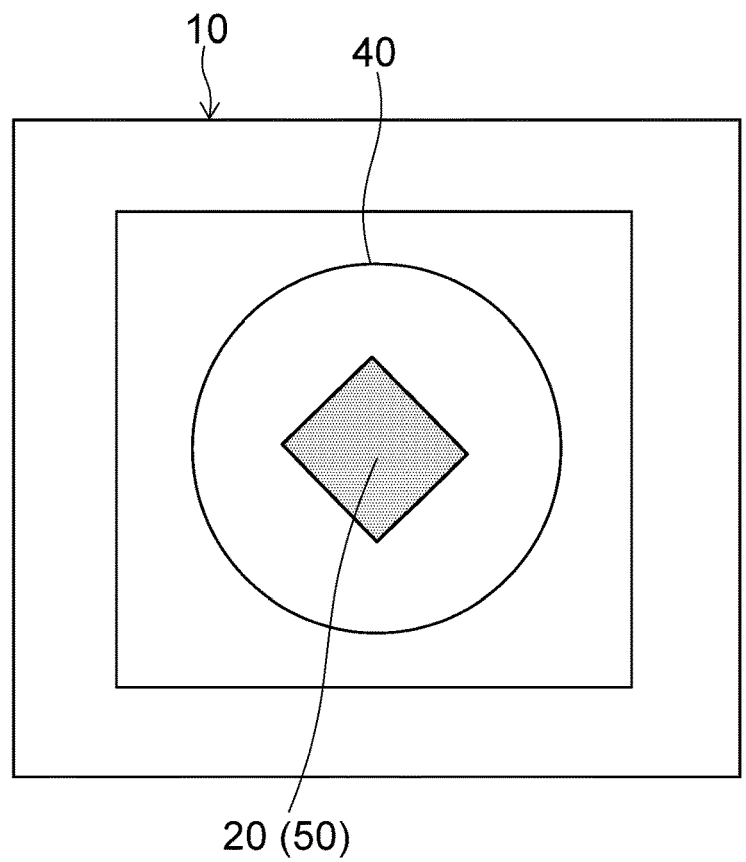
FIG. 3 is a schematic plan view of portion A of FIG. 1.

FIG. 3 is a schematic plan view of portion A of FIG. 1.

The light guide plate 10 is a member that is transmissive to the light emitted by the light-emitting element 30 and the light emitted by the fluorescent included in the fluorescent layer 20, receives the light of the light-emitting element 30 and the fluorescent layer 20, and emits the light in a planar configuration from a first major surface 11.

For example, a thermoplastic resin such as acrylic, polycarbonate, cyclic polyolefin, polyethylene terephthalate, polyester, or the like, a thermosetting resin such as epoxy, silicone, or the like, glass, etc., can be used as the material of the light guide plate 10. Polycarbonate which is inexpensive and has high transparency is favorable among these materials.

The light guide plate 10 has a first major surface 11 used as a light-emitting surface, a second major surface 12 on the side opposite to the first major surface 11, and a recess 15 provided in the second major surface 12.

The fluorescent layer 20 is provided in the recess 15. The light-emitting element 30 is bonded to the fluorescent layer 20 on the second major surface 12 side of the light guide plate 10. The recess 15 can function as the alignment portion of the light-emitting element 30 with respect to the light guide plate 10.

The light-emitting element 30 has a main light-emitting surface 31 where the light mainly is extracted, and a pair of positive and negative electrodes 32 provided on the side opposite to the main light-emitting surface 31. For example, the light-emitting element 30 includes a transparent substrate such as sapphire or the like and a semiconductor stacked structure that is stacked on the transparent substrate. The semiconductor stacked structure includes, for example, $In_xAl_yGa_{1-x-y}N$ ($0 \leq x$, $0 \leq y$, and $x+y \leq 1$) and can emit blue light.

For example, the main light-emitting surface 31 of the light-emitting element 30 is bonded to the fluorescent layer 20 by a transparent bonding agent. The side surface and the electrodes 32 of the light-emitting element 30 are positioned outside the recess 15.

The fluorescent layer 20 includes a main material, and a fluorescent dispersed in the main material. For example, an epoxy resin, a silicone resin, glass, etc., can be used as the material of the main material of the fluorescent layer 20. From the perspective of lightfastness and ease of forming, it is favorable to use a silicone resin as the main material.

The fluorescent is excited by the light emitted by the light-emitting element 30 and emits light of a wavelength different from the wavelength of the light emitted by the light-emitting element 30. For example, a YAG fluorescent, a β-sialon fluorescent, a KSF-based fluorescent, etc., can be used as the fluorescent.

For example, the fluorescent layer 20 that includes a YAG fluorescent having a yellowish light emission can be used with the light-emitting element 30 having a bluish light emission. The fluorescent layer 20 may include multiple types of fluorescent materials. For example, the color reproduction range of the light-emitting device 1 can be widened by using the fluorescent layer 20 including a β-sialon fluorescent having a greenish light emission and a KSF-based fluorescent having a reddish light emission with the light-emitting element 30 having a bluish light emission.

A recess 16 is provided in the first major surface 11 of the light guide plate 10. An optical functional portion 40 is provided in the recess 16. The optical functional portion 40 is provided at a position opposing the recess 15 formed in the second major surface 12. In other words, the optical functional portion 40 is provided at a position opposing the fluorescent layer 20 provided in the recess 15 and the light-emitting element 30 bonded to the fluorescent layer 20. It is favorable for the optical axis of the light-emitting element 30 and the optical axis of the optical functional portion 40 to substantially match. The configuration of the recess 16 is, for example, an inverted polygonal pyramid such as an inverted circular cone, an inverted quadrilateral pyramid, an inverted hexagonal pyramid, etc., or an inverted truncated circular cone, an inverted truncated polygonal pyramid, etc.

The optical functional portion 40 is a transparent resin, glass, air, or the like that has a lower refractive index than the light guide plate 10 and can function as a lens widening the light in the planar direction of the light guide plate 10 by refracting the light at the interface between the light guide plate 10 and the optical functional portion 40.

A light-scattering layer 50 that includes a light-scattering agent is provided on the upper surface of the fluorescent layer 20. The light-scattering layer 50 scatters a portion of the light emitted directly upward from the light-emitting element 30 and returns a portion of the light downward. Thereby, the region of the first major surface 11 of the light guide plate 10 which is the light-emitting surface of the light-emitting device 1 can be suppressed from being too bright at the vicinity directly above the light-emitting element 30 compared to the other regions.

The light guide plate 10 has a side surface 13 that continues from the first major surface 11 and forms a substantially right angle with the first major surface 11. The light guide plate 10 also has a tilted surface 14 continuing from the second major surface 12 and forming an obtuse angle with the second major surface 12. The tilted surface 14 and the second major surface 12 are covered with the light-reflective resin member 60. Therefore, the light that travels through the light guide plate 10 toward the tilted surface 14 and the second major surface 12 can be reflected by the light-reflective resin member 60 and oriented toward the first major surface 11.

The light-reflective resin member 60 covers the side surface of the light-emitting element 30. Therefore, the light that is emitted from the side surface of the light-emitting element 30 can be reflected by the light-reflective resin member 60, oriented toward the main light-emitting surface 31 of the light-emitting element 30, and introduced to the fluorescent layer 20 from the main light-emitting surface 31. The light-reflective resin member 60 is insulative and seals the electrodes 32 of the light-emitting element 30.

The light-reflective resin member 60 is reflective to the light emitted by the light-emitting element 30 and the light emitted by the fluorescent layer 20 and is, for example, a resin including a white pigment, etc. In particular, it is favorable for the light-reflective resin member 60 to be a silicone resin including titanium oxide.

The light-reflective resin member 60 includes a first light-reflecting portion 61 provided on the tilted surface 14 of the light guide plate 10, and a second light-reflecting portion 62 provided on the second major surface 12 of the light guide plate 10.

The first interconnect 71 is provided on the lower surface of the second light-reflecting portion 62 along the second major surface 12. The first interconnect 71 is connected to the electrodes 32 of the light-emitting element 30. In the case where the light-emitting device 1 includes the multiple light-emitting elements 30, the first interconnect 71 connects the electrodes 32 of mutually-adjacent light-emitting elements 30 to each other as shown in FIG. 1.

A module side surface 81 of the module main body 80 including the light guide plate 10 and the light-reflective resin member 60 includes a transparent portion 17 and the first light-reflecting portion 61 of the light-reflective resin member 60.

The transparent portion 17 includes the side surface 13 provided on the first major surface 11 side of the light guide plate 10. The first light-reflecting portion 61 is provided on the second major surface 12 side of the transparent portion 17.

The second interconnect 72 is provided on the first light-reflecting portion 61 of the module side surface 81; and the second interconnect 72 leaves the transparent portion 17 exposed. The second interconnect 72 is connected to the first interconnect 71 on the lower surface side of the light-reflective resin member 60.

The first interconnect 71 and the second interconnect 72 are, for example, a metal film formed as one body by sputtering. The first interconnect 71 and the second interconnect 72 include, for example, copper, gold, silver, aluminum, etc.

The multiple fluorescent layers 20, the multiple light-scattering layers 50, and the multiple optical functional portions 40 are provided to correspond respectively to the light-emitting elements 30 in the case where the light-emitting device 1 includes the multiple light-emitting elements 30.

A surface-emitting light source that has a wider light emission surface area can be configured by multiply combining the light-emitting device 1 shown in FIG. 1.

Figure 4:
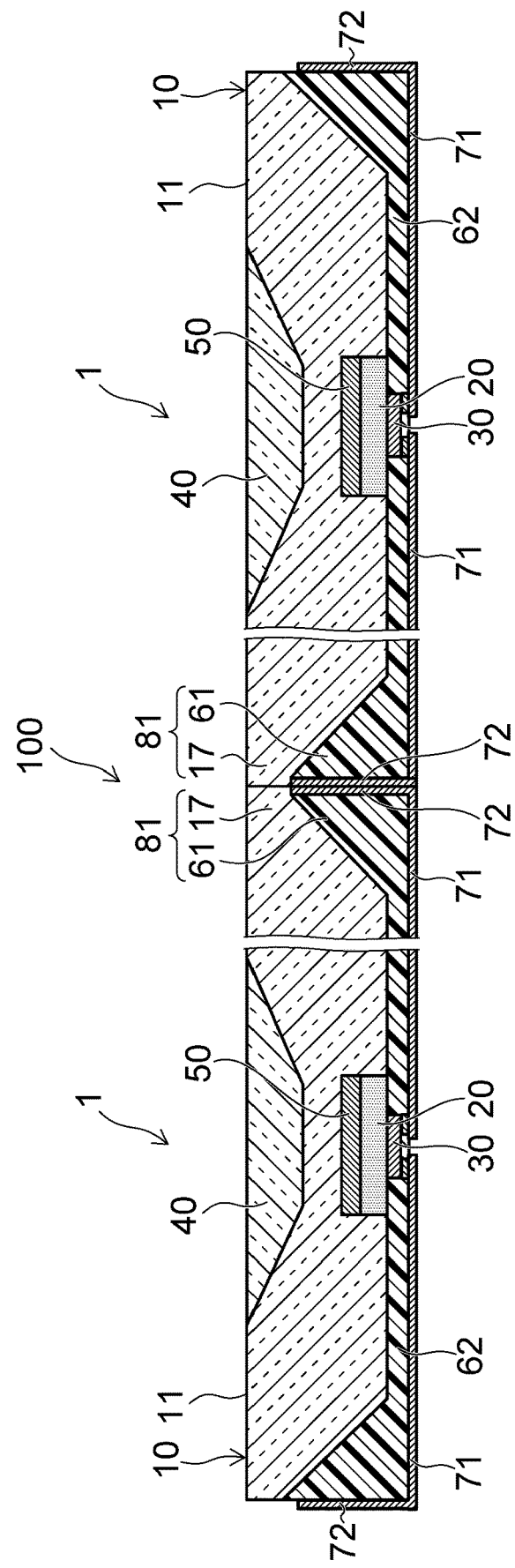
FIG. 4 is a schematic cross-sectional view of a surface-emitting light source of an embodiment.

FIG. 4 is a schematic cross-sectional view of a surface-emitting light source 100 of an embodiment.

Figure 5:
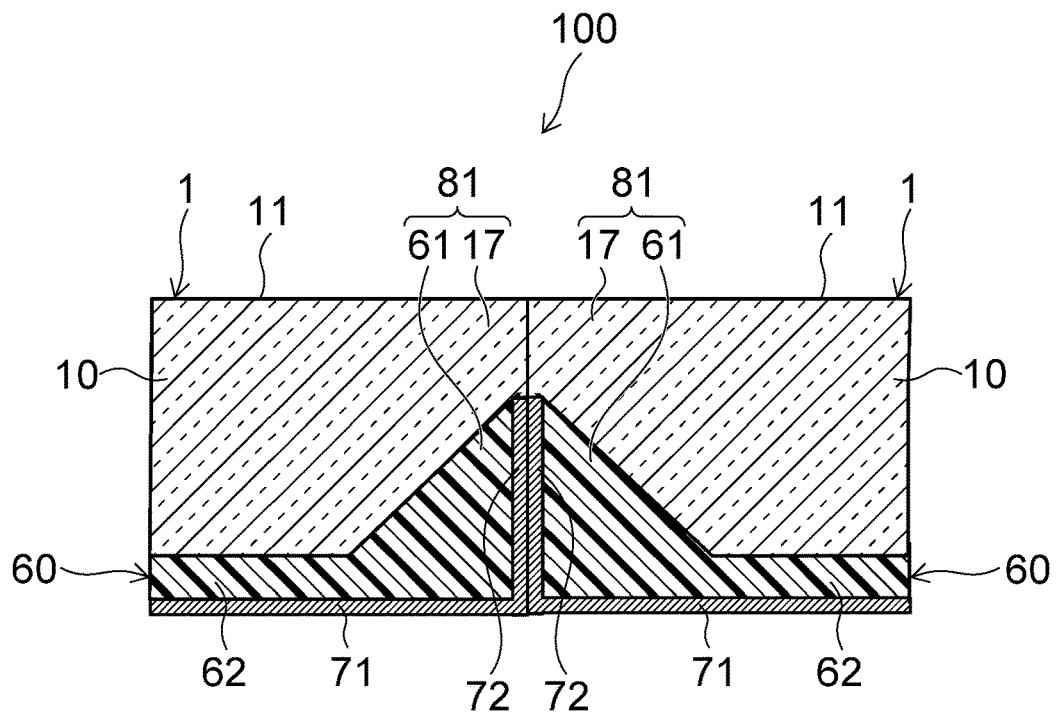
FIG. 5 is an enlarged cross-sectional view of a connection portion between the light-emitting devices of FIG. 4.

FIG. 5 is an enlarged cross-sectional view of the connection portion between the light-emitting devices 1 of FIG. 4.

The multiple light-emitting devices 1 are arranged to cause the module side surfaces 81 to be adjacent to each other. The second interconnects 72 that are formed on the module side surfaces 81 of the adjacent light-emitting devices 1 are connected to each other directly or via a conductive material. For example, the second interconnects 72 can be directly bonded to each other by applying heat and mechanical pressure. Or, the second interconnects 72 can be bonded to each other by a conductive material such as a conductive paste, etc.

The transparent portions 17 are bonded to each other at the module side surfaces 81. Because the transparent portions are provided at the boundary between the adjacent light-emitting devices 1 on the light-emitting surface side of the surface-emitting light source 100 and because the second interconnects 72 are not provided on the transparent portions 17, the boundary between the light-emitting devices 1 is not dark; and a brightness and a color that are uniform in the planar direction can be obtained.

In the case where the transparent portions 17 at the side surfaces of the light-emitting devices 1 protrude further than the second interconnects 72, a gap may be formed between the adjacent second interconnects 72. In such a case, the second interconnects 72 can be electrically connected to each other by providing a conductive material in the gap between the second interconnects 72.

Or, in the case where a gap is formed between the adjacent transparent portions 17 in the state in which the second interconnects 72 are bonded to each other, the luminance at the boundary between the light-emitting devices 1 may be reduced if foreign matter enters the gap. Therefore, in the case where the gap is formed between the adjacent transparent portions 17, it is desirable to provide a light-transmissive material (a resin or glass) in the gap.

Figure 6:
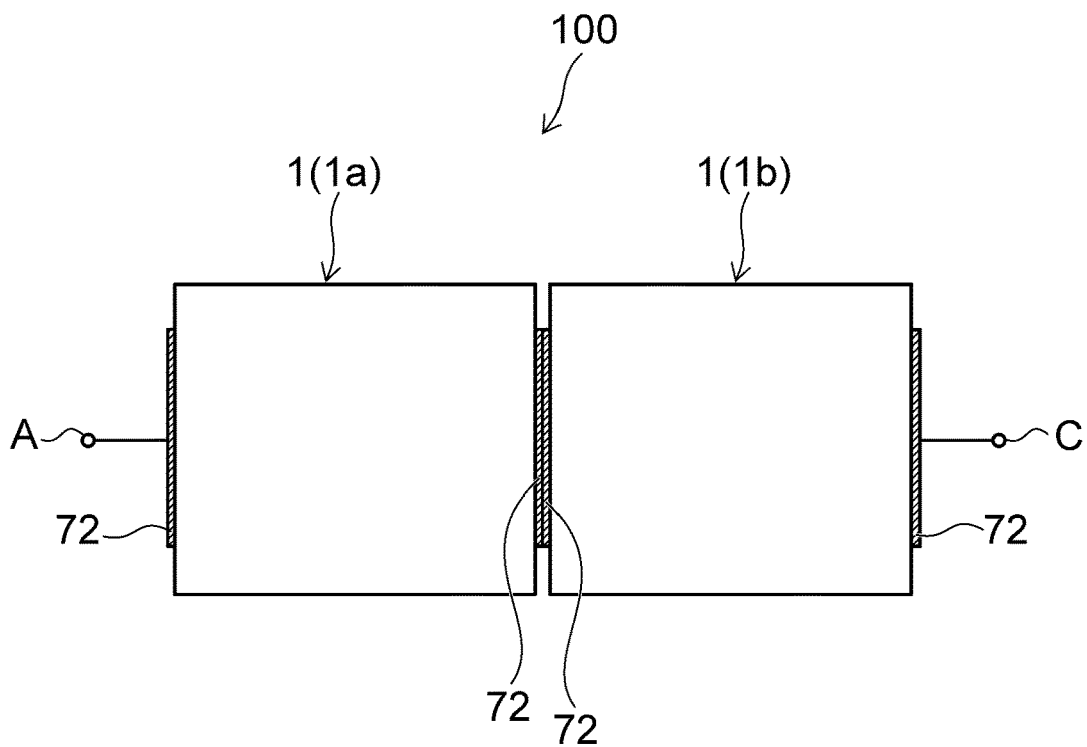
FIG. 6 is a schematic plan view of the surface-emitting light source of the embodiment.
Figure 7:
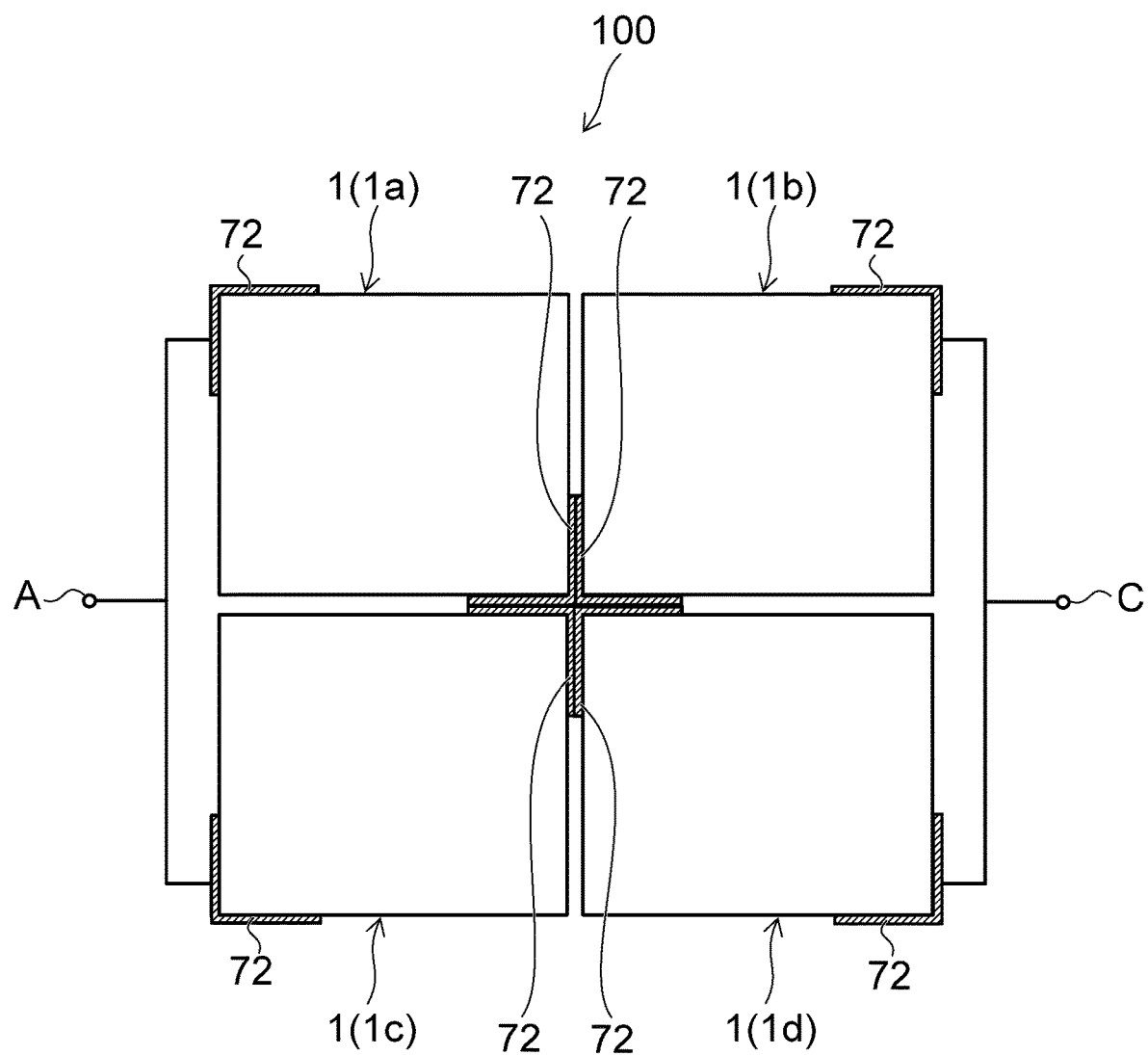
FIG. 7 is a schematic plan view of the surface-emitting light source of the embodiment.

FIG. 6 and FIG. 7 are schematic plan views of the surface-emitting light source 100.

One light-emitting device 1 is formed in a configuration that is quadrilateral or has four sides when viewed in plan. The four sides correspond to the side surface of the light-emitting device 1. In the example shown in FIG. 6, the second interconnects 72 are provided at two opposing sides of the four sides of the light-emitting device 1. The second interconnect 72 is provided partially over one side but does not extend over the entire one side.

In the example shown in FIG. 6, for example, two light-emitting devices 1*a* and 1*b* are electrically connected to each other via the second interconnects 72. One second interconnect 72 of the one light-emitting device 1*a* is connected to an anode terminal A. The other second interconnect 72 of the one light-emitting device 1*a* is connected to one second interconnect 72 of the other light-emitting device 1*b*. The other second interconnect 72 of the other light-emitting device 1*b* is connected to a cathode terminal C. In other words, the multiple light-emitting devices 1*a* and 1*b* are directly connected between the anode terminal A and the cathode terminal C via the second interconnects 72 provided on the side surfaces.

In the example shown in FIG. 7, the surface-emitting light source 100 includes, for example, the four light-emitting devices 1*a*, 1*b*, 1*c*, and 1*d* arranged in a matrix configuration. The light-emitting device 1*a* and the light-emitting device 1*b* are connected in series to each other. The light-emitting device 1*c* and the light-emitting device 1*d* are connected in series to each other. The light-emitting device group that includes the light-emitting device 1*a* and the light-emitting device 1*b* and the light-emitting device group that includes the light-emitting device 1*c* and the light-emitting device 1*d* are connected in parallel between the anode terminal A and the cathode terminal C.

One light-emitting device 1 includes the two second interconnects 72 provided along two corner portions at mutually-diagonal positions. One second interconnect 72 of the two second interconnects 72 is connected to the second interconnects 72 of other light-emitting devices 1 in the lateral direction and the longitudinal direction of the matrix array. The other second interconnect 72 is connected to an external terminal (the anode terminal A or the cathode terminal C).

In the light-emitting device 1 of the embodiment, because the light-emitting element 30 is mounted in the light guide plate 10, the distance between the light guide plate 10 and the light-emitting element 30 can be small; and a thinner light-emitting device 1 is possible.

Further, because the connection between the adjacent light-emitting devices 1 and the connection to the outside is formed via the second interconnects 72 provided on the module side surfaces 81, a wiring substrate is unnecessary on the second major surface 12 side of the light guide plate 10, which is advantageous for realizing a thinner device.

Because the fluorescent layer 20 is provided not on the first major surface 11 which is the light-emitting surface of the light guide plate 10 but on the second major surface 12 side on the side opposite to the first major surface 11, the light that undergoes wavelength conversion in the fluorescent layer 20 can be diffused in the planar direction by the light guide plate 10 and the optical functional portion 40; and uneven color in the surface of the light guide plate 10 can be suppressed.

For example, the light-emitting device 1 and the surface-emitting light source 100 of the embodiment can be used in the backlight of a liquid crystal display. For example, in a direct-type liquid crystal display in which the backlight is disposed at the back surface of the liquid crystal panel, the distance between the liquid crystal panel and the light-emitting device is short; therefore, uneven color of the light-emitting device easily causes uneven color of the liquid crystal display. Therefore, the uneven color of the liquid crystal display can be reduced by using, as the backlight of the direct-type liquid crystal display, the light-emitting device 1 and the surface-emitting light source 100 such as those of the embodiment that have low uneven color.

Figure 8:
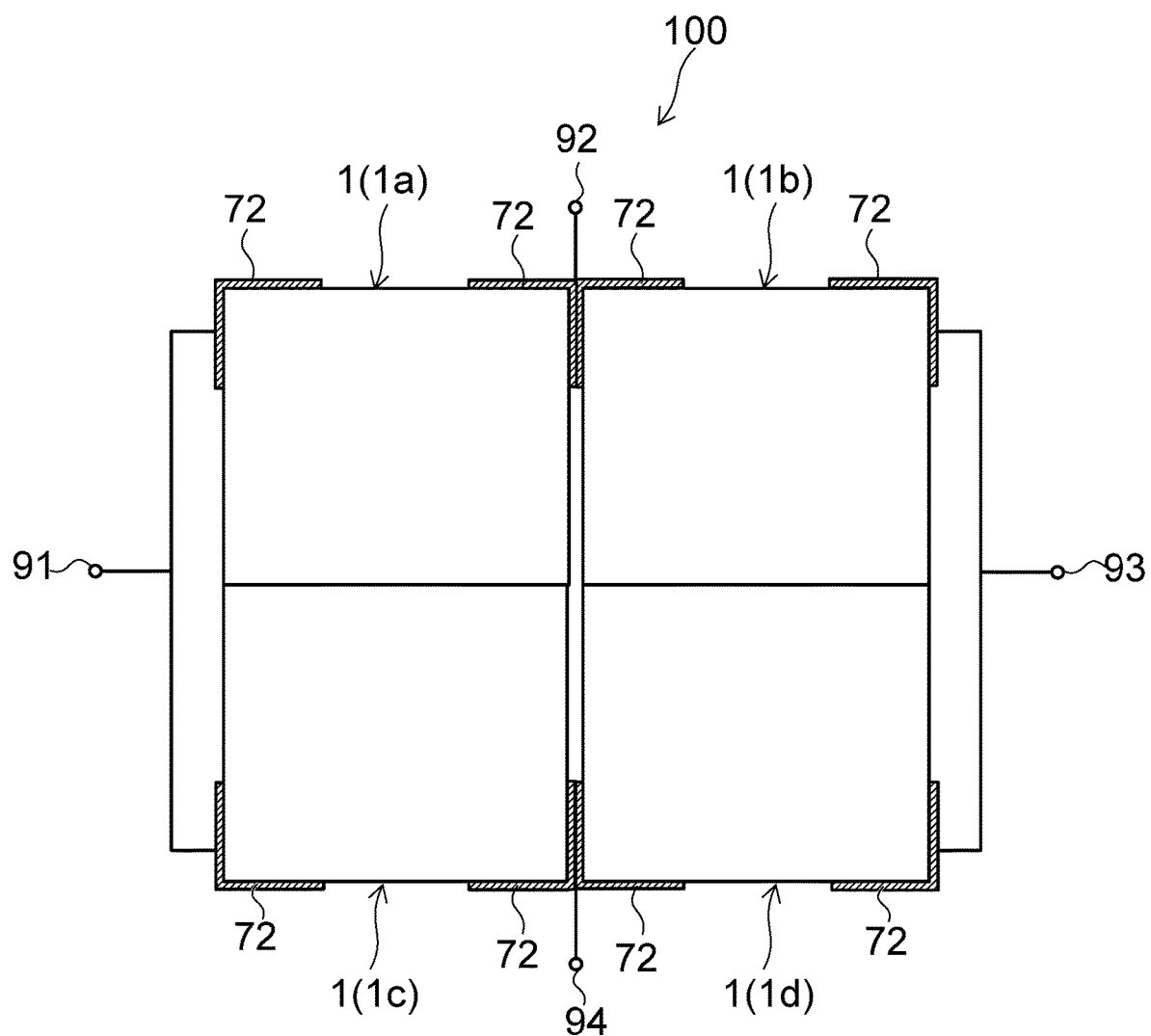
FIG. 8 is a schematic plan view of the surface-emitting light source of the embodiment.

FIG. 8 is a schematic plan view of another example of the surface-emitting light source 100.

The surface-emitting light source 100 includes, for example, the four light-emitting devices 1*a*, 1*b*, 1*c*, and 1*d* arranged in a matrix configuration.

The light-emitting device 1*a* includes two second interconnects 72 provided along two corners positioned at the two ends of the same one side; one of the two second interconnects 72 is connected to a terminal 91; and the other of the two second interconnects 72 is connected to a terminal 92.

The light-emitting device 1*b* includes two second interconnects 72 provided along two corners positioned at the two ends of the same one side; one of the two second interconnects 72 is connected to the terminal 92; and the other of the two second interconnects 72 is connected to a terminal 93.

The light-emitting device 1*c* includes two second interconnects 72 provided along two corners positioned at the two ends of the same one side; one of the two second interconnects 72 is connected to the terminal 91; and the other of the two second interconnects 72 is connected to a terminal 94.

The light-emitting device 1*d* includes two second interconnects 72 provided along two corners positioned at the two ends of the same one side; one of the two second interconnects 72 is connected to the terminal 94; and the other of the two second interconnects 72 is connected to the terminal 93.

The second interconnect 72 of the light-emitting device 1a connected to the terminal 92 and the second interconnect 72 of the light-emitting device 1b connected to the terminal 92 are bonded to each other between the side surface of the light-emitting device 1a and the side surface of the light-emitting device 1b.

The second interconnect 72 of the light-emitting device 1c connected to the terminal 94 and the second interconnect 72 of the light-emitting device 1d connected to the terminal 94 are bonded to each other between the side surface of the light-emitting device 1c and the side surface of the light-emitting device 1d.

Only the light-emitting device 1a can be switched ON by causing a current to flow between the terminal 91 and the terminal 92.

Only the light-emitting device 1b can be switched ON by causing a current to flow between the terminal 92 and the terminal 93.

Only the light-emitting device 1c can be switched ON by causing a current to flow between the terminal 91 and the terminal 94.

Only the light-emitting device 1d can be switched ON by causing a current to flow between the terminal 94 and the terminal 93.

All of the light-emitting devices 1a, 1b, 1c, and 1d can be switched ON by causing a current to flow between the terminal 91 and the terminal 93.

FIG. 9A to FIG. 9D are schematic cross-sectional views showing a method for manufacturing the light-emitting device 1 of the embodiment.

Figure 9A:
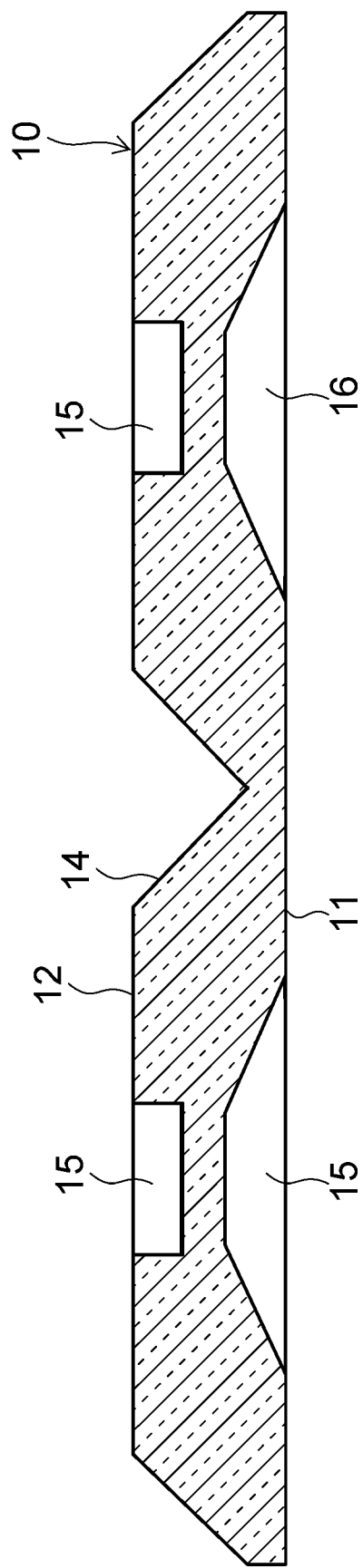
FIG. 9A to FIG. 9D are schematic cross-sectional views showing a method for manufacturing the light-emitting device of the embodiment.

First, the light guide plate 10 is prepared as shown in FIG. 9A.

For example, the light guide plate 10 can be formed by injection molding, transfer molding, thermal transfer, etc. The alignment precision between the optical functional portion 40 and the light-emitting element 30 can be high by using a mold to collectively form the recess 16 where the optical functional portion 40 is provided and to form the recess 15 which is used as the alignment portion of the light-emitting element 30 and is where the fluorescent layer 20 is provided.

Figure 9B:
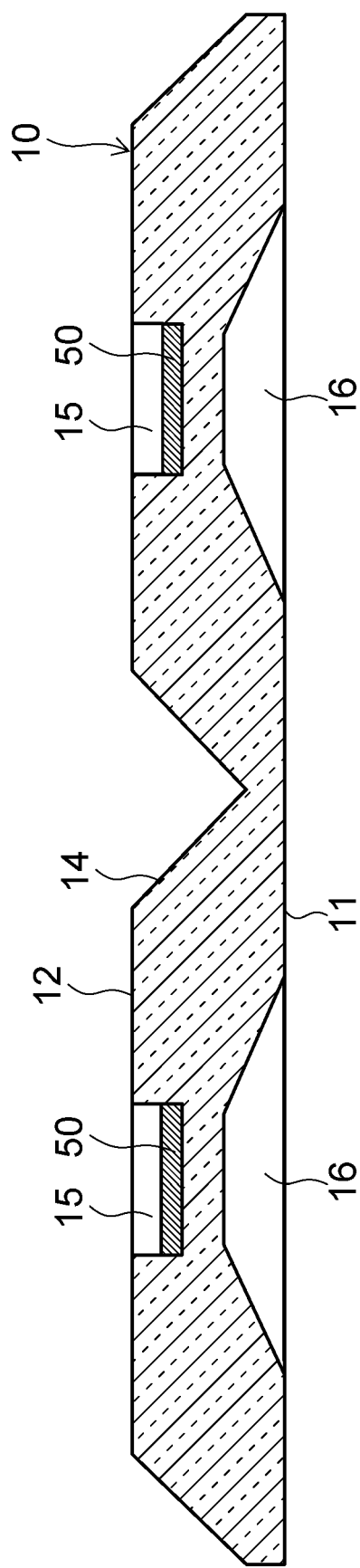

As shown in FIG. 9B, the light-scattering layer 50 is provided on the bottom surface of the recess 15. For example, the light-scattering layer 50 can be formed by a method such as potting, printing, spraying, etc.

Figure 9C:
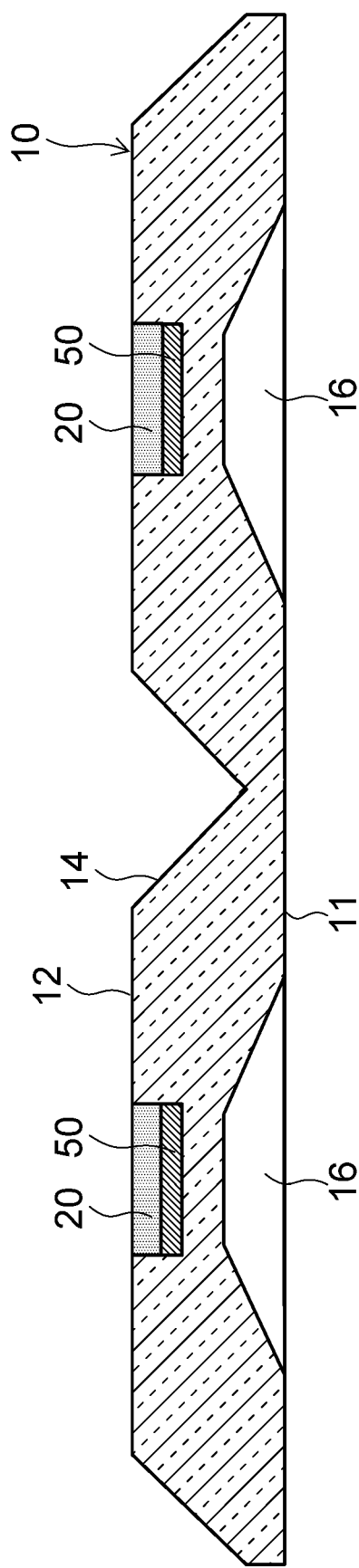

As shown in FIG. 9C, the fluorescent layer 20 is provided on the light-scattering layer 50 inside the recess 15. For example, the fluorescent layer 20 can be formed by a method such as potting, printing, spraying, etc.

Figure 9D:
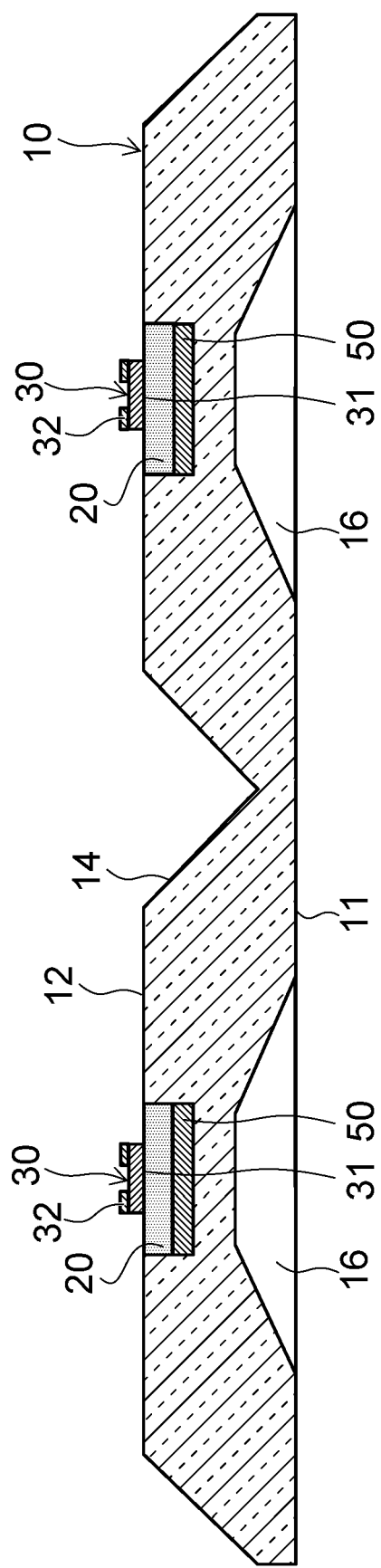

As shown in FIG. 9D, the light-emitting element 30 is disposed on the fluorescent layer 20. The main light-emitting surface 31 of the light-emitting element 30 is bonded to the fluorescent layer 20.

Subsequently, the optical functional portion 40 described above may be provided in the recess 16 on the first major surface 11 side of the light guide plate 10. Further, the light-reflective resin member 60 is provided to cover the second major surface 12 and the tilted surface 14 of the light guide plate 10.

The processes may proceed up to this point in the wafer or panel state; subsequently, dicing may be performed at the appropriate location as necessary.

Then, the first interconnect 71 and the second interconnect 72 are formed as one body by forming, for example, a metal film by sputtering on the side surface of the light-reflective resin member 60 and the lower surface continuing from the side surface that are exposed by the dicing.

The embodiments of the present invention have been described with reference to specific examples. However, the present invention is not limited to these specific examples. Based on the above-described embodiments of the present invention, all embodiments that can be implemented with appropriately design modification by one skilled in the art are also within the scope of the present invention as long as the gist of the present invention is included. Besides, within the scope of the spirit of the present invention, one skilled in the art can conceive various modifications, and the modifications fall within the scope of the present invention.

What is claimed is:

1. A light-emitting device, comprising:
   a light guide plate having a first major surface, a second major surface, a side surface between the first and second major surfaces, and a recess, wherein the first major surface functions as a light-emitting surface, the second major surface is located on a side opposite to the first major surface, and the recess is provided in the second major surface;
   a fluorescent layer provided in the recess;
   a light-emitting element bonded to the fluorescent layer, wherein the light-emitting element includes an electrode on a surface of the light-emitting element on a side opposite to a surface of the light-emitting element bonded to the fluorescent layer;
   a module side surface including at least a portion of the side surface of the light guide plate;
   a light-reflective resin member provided on the second major surface of the light guide plate;
   a first interconnect provided on the light-reflective resin member and connected to the electrode of the light-emitting element; and
   a second interconnect provided on the module side surface and connected to the first interconnect.

2. The device according to claim 1, wherein
the module side surface includes:
   a transparent portion including a portion of the side surface of the light guide plate provided adjacent to the first major surface side of the light guide plate; and
   a first light-reflecting portion provided on the second major surface of the light guide plate.

3. The device according to claim 2, wherein the second interconnect is provided on the first light-reflecting portion and leaves the transparent portion exposed.

4. The device according to claim 3, wherein the transparent portion protrudes further than the second interconnect at the module side surface.

5. The device according to claim 2, wherein the transparent portion protrudes further than the second interconnect at the module side surface.

6. The device according to claim 1, wherein the light-reflective resin member covers a side surface of the light-emitting element.

7. The device according to claim 6, wherein the side surface and the electrode of the light-emitting element are positioned outside the recess of the light guide plate.

8. The device according to claim 1, further comprising an optical functional portion provided at a position opposing the recess at the first major surface of the light guide plate, a refractive index of the optical functional portion being lower than a refractive index of the light guide plate.

9. A surface-emitting light source, comprising a plurality of the light-emitting devices according to claim 1 arranged such that the module side surfaces are adjacent to each other, wherein the second interconnects of the adjacent light-emitting devices are connected to each other directly or via a conductive material.

10. The device according to claim 1, wherein the first interconnect is provided on a lower surface of the light-reflective resin member along the second major surface.

* * * * *